(12) United States Patent
Kim et al.

(10) Patent No.: US 9,054,037 B2
(45) Date of Patent: Jun. 9, 2015

(54) METHOD OF FABRICATING SEMICONDUCTOR DEVICE

(71) Applicant: SAMSUNG ELECTRONICS CO., LTD., Suwon-si, Gyeonggi-do (KR)

(72) Inventors: Dong-Chan Kim, Anyang-si (KR); Tai-Su Park, Seoul (KR); Ju-Eun Kim, Hwaseong-si (KR); Ki-Hong Nam, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/060,806

(22) Filed: Oct. 23, 2013

(65) Prior Publication Data

US 2014/0134812 A1 May 15, 2014

(30) Foreign Application Priority Data

Nov. 13, 2012 (KR) ........................ 10-2012-0128223

(51) Int. Cl.
| | | |
|---|---|---|
| *H01L 21/336* | (2006.01) | |
| *H01L 21/28* | (2006.01) | |
| *H01L 29/51* | (2006.01) | |
| *H01L 21/02* | (2006.01) | |
| *H01L 27/108* | (2006.01) | |

(52) U.S. Cl.
CPC .... *H01L 21/28185* (2013.01); *H01L 21/28194* (2013.01); *H01L 29/513* (2013.01); *H01L 29/517* (2013.01); *H01L 27/10814* (2013.01); *H01L 27/10876* (2013.01); *H01L 27/10888* (2013.01); *H01L 21/02164* (2013.01); *H01L 21/0228* (2013.01)

(58) Field of Classification Search
CPC ............ H01L 21/28158; H01L 21/324; H01L 29/66666; H01L 29/7827
USPC .......................................... 438/270, 359, 437
See application file for complete search history.

(56) References Cited

U.S. PATENT DOCUMENTS

| | | | |
|---|---|---|---|
| 6,187,648 B1 | 2/2001 | Doi et al. | |
| 6,329,261 B1 * | 12/2001 | Kishimoto | 438/359 |
| 6,734,082 B2 | 5/2004 | Zheng et al. | |
| 7,276,774 B2 | 10/2007 | Raaijmakers et al. | |
| 8,772,117 B2 * | 7/2014 | Chi et al. | 438/294 |
| 2001/0006839 A1 | 7/2001 | Yeo | |
| 2003/0161951 A1 * | 8/2003 | Yuan et al. | 427/255.28 |
| 2005/0260357 A1 | 11/2005 | Olsen et al. | |
| 2007/0287261 A1 * | 12/2007 | Raaijmakers et al. | 438/437 |
| 2009/0020845 A1 * | 1/2009 | Shin et al. | 257/506 |
| 2009/0155977 A1 * | 6/2009 | Han et al. | 438/424 |

FOREIGN PATENT DOCUMENTS

| | | |
|---|---|---|
| JP | 2004-047851 A | 2/2004 |
| KR | 10-2005-0014221 A | 2/2005 |
| KR | 10-0533966 B1 | 11/2005 |
| KR | 10-2006-0061706 A | 6/2006 |
| KR | 10-2007-0002304 A | 1/2007 |

* cited by examiner

*Primary Examiner* — Long K Tran
(74) *Attorney, Agent, or Firm* — Lee & Morse, P.C.

(57) ABSTRACT

A method of fabricating a semiconductor device includes forming a trench in a substrate, forming a pre-gate insulating film along side surfaces and a bottom surface of the trench, and oxidizing the pre-gate insulating film through a densification process.

20 Claims, 12 Drawing Sheets

METHOD OF FABRICATING SEMICONDUCTOR DEVICE

Korean Patent Application No. 10-2012-0128223 filed on Nov. 13, 2012, in the Korean Intellectual Property Office, and entitled: "METHOD OF FABRICATING SEMICONDUCTOR DEVICE," is incorporated by reference herein in its entirety.

BACKGROUND

1. Field

Embodiments relate to a method of fabricating a semiconductor device.

2. Description of the Related Art

A buried channel array transistor (BCAT) can overcome a short-channel effect due to a gate electrode buried in a trench. Characteristics (such as gate-induced drain leakage (GIDL) and the amount of electric current) of the BCAT may vary according to the depth of the gate electrode from the surface of a substrate.

SUMMARY

Embodiments are directed to a method of fabricating a semiconductor device, including forming a trench in a substrate, forming a pre-gate insulating film along side surfaces and a bottom surface of the trench, and oxidizing the pre-gate insulating film through a densification process.

The densification process may include at least one of a thermal oxidation process, a plasma oxidation process, an ultraviolet oxidation process, and an ozone oxidation process.

The method may further include performing a high-temperature annealing process after the densification process.

The method may further include forming a first gate insulating film by further oxidizing the pre-gate insulating film, and then forming a gate electrode in the trench having the first gate insulating film to partially fill the trench.

The method may further include repeating the forming of the pre-gate insulating film and the oxidizing of the pre-gate insulating film through the densification process to form a first gate insulating film on the side surfaces and bottom surface of the trench, and then forming a gate electrode in the trench having the first gate insulating film to partially fill the trench.

The method may further include forming a second gate insulating film on the bottom surface of the trench using a biased plasma oxidation process before the forming of the pre-gate insulating film.

The method may further include oxidizing the bottom surface and side surfaces of the trench before the forming of the pre-gate insulating film.

The pre-gate insulating film may be formed by atomic layer deposition (ALD).

The method may further include cleaning the trench before the forming of the pre-gate insulating film.

The pre-gate insulating film may include silicon oxide.

Embodiments are also directed to a method of fabricating a semiconductor device including forming a device isolation region in a substrate to define an active region, forming a trench that crosses the active region and the device isolation region, forming a pre-gate insulating film along side surfaces and a bottom surface of the trench using atomic layer deposition (ALD), and oxidizing the pre-gate insulating film through a densification process. The bottom surface of the trench is uneven.

The densification process includes at least one of a thermal oxidation process, a plasma oxidation process, an ultraviolet oxidation process, and an ozone oxidation process.

The method may further include forming a first gate insulating film by oxidizing the pre-gate insulating film and then forming a gate electrode in the trench having the first gate insulating film to partially fill the trench.

The method may further include forming a second gate insulating film on the bottom surface of the trench using a biased plasma oxidation process before the forming of the pre-gate insulating film.

The method may further include repeating the forming of the pre-gate insulating film and the oxidizing of the pre-gate insulating film to form a first gate insulating film on the side surfaces and bottom surface of the trench, and then forming a gate electrode in the trench having the first gate insulating film to partially fill the trench.

Embodiments are also directed to a method of fabricating a semiconductor device including forming a trench in a substrate, forming a silicon monolayer along side surfaces and a bottom surface of the trench by atomic layer deposition (ALD), oxidizing the silicon monolayer to form a silicon oxide film, repeating forming the silicon monolayer and oxidizing the silicon monolayer to form a pre-gate insulating film of silicon oxide on the side surfaces and bottom surfaces of the trench, and performing a densification process to further oxidize the pre-gate insulating film to form a gate insulating film.

Forming the silicon monolayer may include depositing a silicon precursor. Oxidizing the silicon monolayer may include supplying an oxygen precursor.

The densification process may include at least one of a thermal oxidation process, a plasma oxidation process, an ultraviolet oxidation process, and an ozone oxidation process.

The method may further include performing a high-temperature annealing process after the densification process.

The method may further include oxidizing the bottom and side surfaces of the trench before an initial forming of the silicon monolayer.

BRIEF DESCRIPTION OF THE DRAWINGS

Features will become apparent to those of skill in the art by describing in detail exemplary embodiments with reference to the attached drawings in which:

FIGS. 2A through 6B and 8 through 12 illustrate views depicting stages of a method of fabricating a semiconductor device according to an embodiment; FIGS. 2A, 3A, 4A, 5A, 6A, and 8 through 12 illustrate cross-sectional views taken along the line A-A of FIG. 1 and FIGS. 2B, 3B, 4B, 5B, and 6B illustrate cross-sectional views taken along the line B-B of FIG. 1;

DETAILED DESCRIPTION

Figure 1:
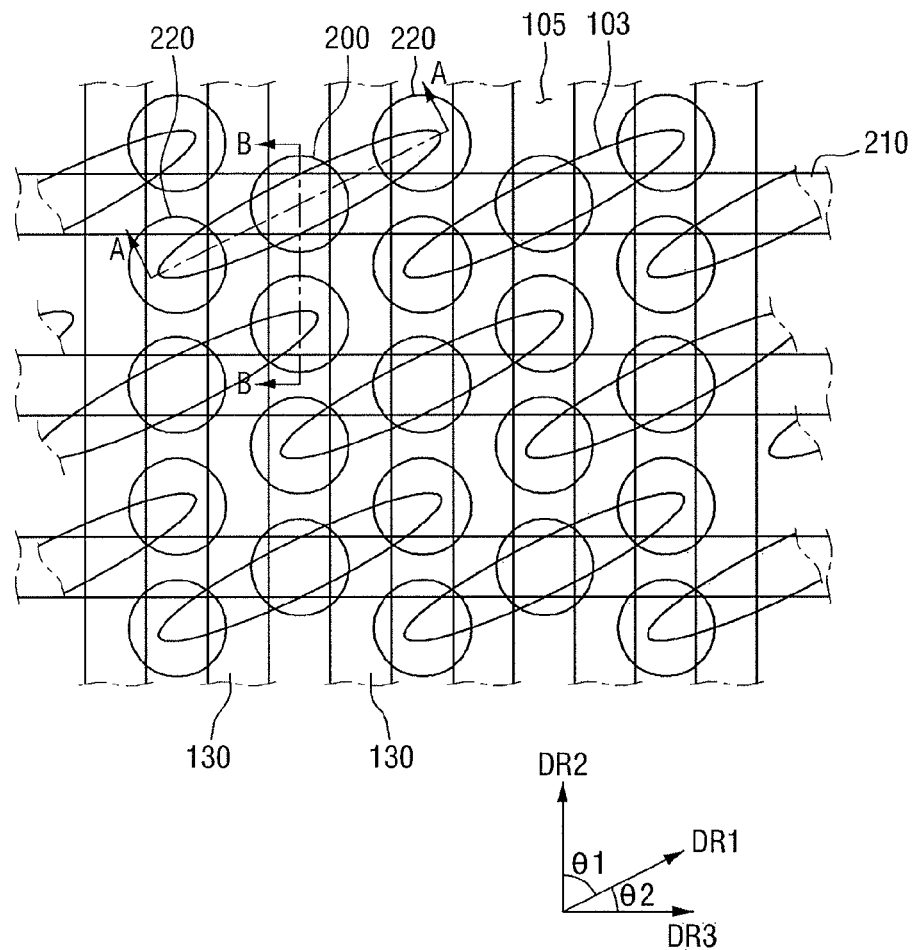
FIG. 1 illustrates a layout view illustrating semiconductor device formed by a method of fabricating a semiconductor device according to embodiments.

Example embodiment's will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

It will be understood that, although the terms first, second, etc. may be used herein to describe various elements, these elements should not be limited by these terms. These terms are only used to distinguish one element from another element. Thus, for example, a first element, a first component, or a first section discussed below could be termed a second element, a second component or a second section without departing from the teachings.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The layout of a semiconductor device fabricated according to embodiments will now be described with reference to FIG. 1.

FIG. 1 is a layout view of a semiconductor device fabricated according to embodiments. In FIG. 1, a dynamic random access memory (DRAM) is illustrated as an example of a semiconductor device fabricated using a method of fabricating a semiconductor device according to embodiments. However, in other embodiments, other semiconductor devices may be fabricated.

Referring to FIG. 1, in the semiconductor device fabricated using the method of fabricating a semiconductor device according to the embodiments, unit active regions 103 are defined by forming device isolation regions 105 in a substrate 100. Specifically, the unit active regions 103 extend in a first direction DR1, and gate electrodes (i.e., word lines) 130 extend in a second direction DR2 which forms an acute angle with the first direction DR1, and bit lines 210 extend in a third direction DR3 which forms an acute angle with the first direction DR1.

When "a direction forms an angle with another direction," the angle is a smaller one of two angles formed by the intersection of the two directions. For example, when the two angles formed by the intersection of the two directions are 120 and 60 degrees, the angle is considered as being 60 degrees. Therefore, referring to FIG. 1, an angle formed by the first direction DR1 and the second direction DR2 is θ1, and an angle formed by the first direction DR1 and the third direction DR3 is θ2.

θ1 and/or θ2 may be formed as an acute angle in order to secure a maximum gap between bit line contacts 200, which connect the unit active regions 103, and the bit lines 210 and storage node contacts 220, which connect the unit active regions 103 and capacitors (not shown). As non-limiting examples, θ1 and θ2 may be 45 and 45 degrees, or 30 and 60 degrees, or 60 and 30 degrees, respectively.

A method of fabricating a semiconductor device according to an embodiment will now be described with reference to FIGS. 1 through 12.

Figure 5A:
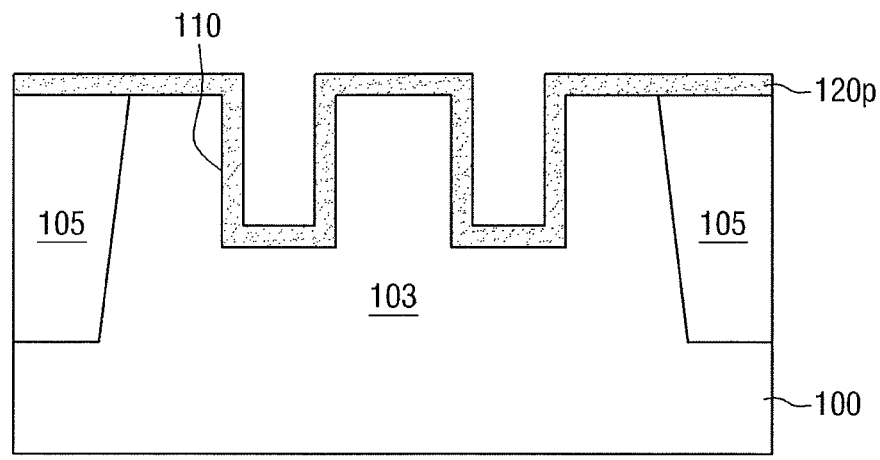
Figure 5B:
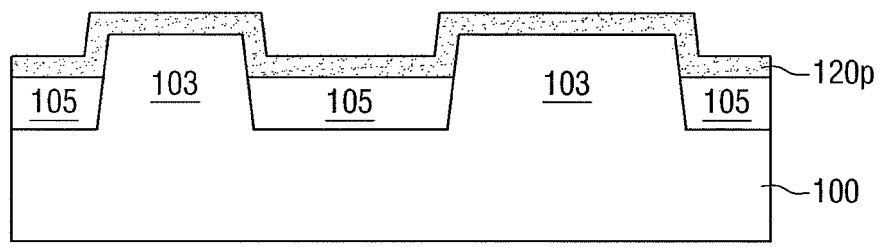
Figure 6A:
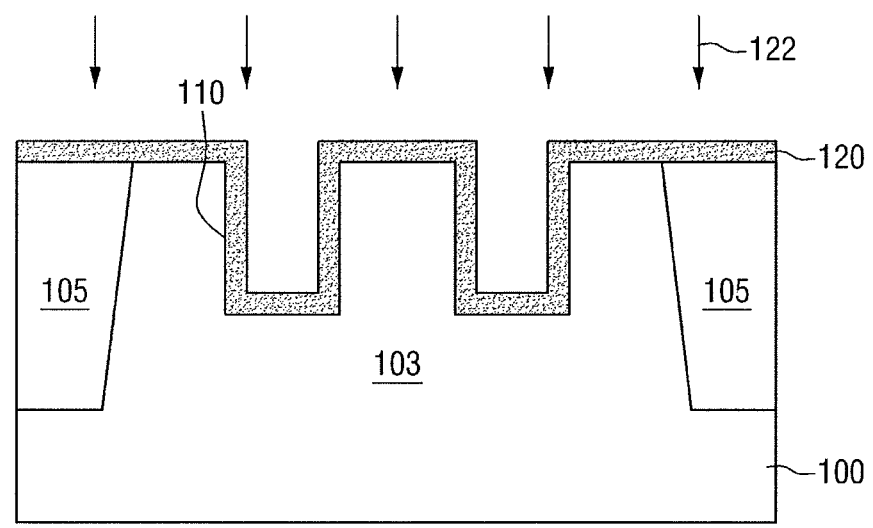
Figure 6B:
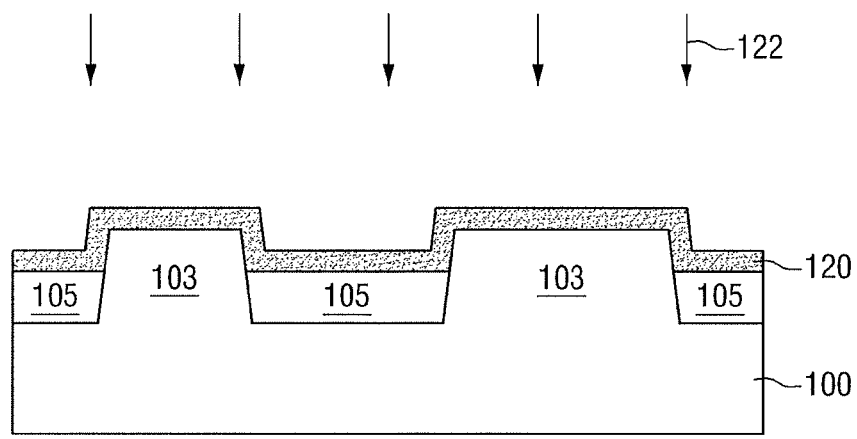
Figure 7:
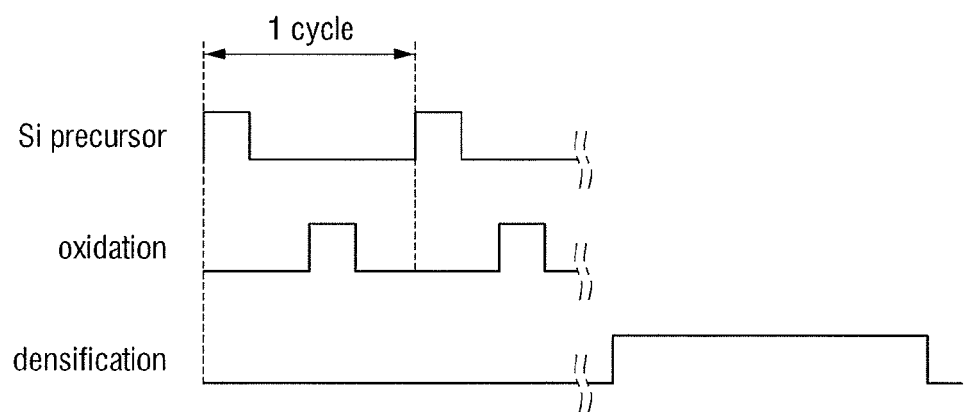
FIG. 7 illustrates a timing diagram with respect to the process stages illustrated in FIGS. 5A through 6B.

FIGS. 2A through 12 illustrate views depicting stages of a method of fabricating a semiconductor device according to an embodiment. FIGS. 2A, 3A, 4A, 5A, 6A, and 8 through 12 illustrate cross-sectional views taken along the line A-A of FIG. 1 and depicting intermediate processes included in the fabrication method according to the current embodiment. FIGS. 2B, 3B, 4B, 5B, and 6B illustrate cross-sectional views taken along the line B-B of FIG. 1 and depicting intermediate processes included in the fabrication method according to the current embodiment. FIG. 7 illustrates a timing diagram with respect to the process stages illustrated in FIGS. 5A through 6B.

Figure 2A:
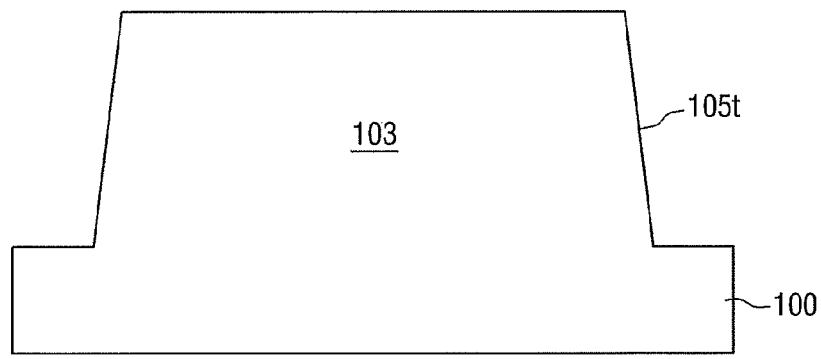
Figure 2B:
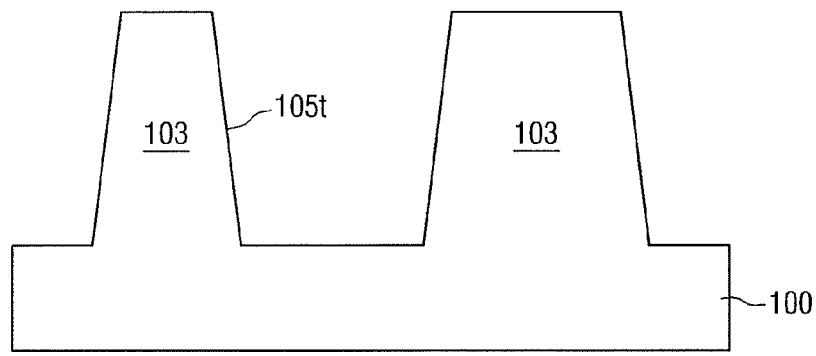

Referring to FIGS. 1, 2A, and 2B, first trenches 105t may be formed on a substrate 100 to define a unit active region 103. Each of the first trenches 105t may be a region in which a device isolation region 105 is to be formed.

For example, mask pattern (not shown) may be formed on the substrate 100 to cover the unit active region 103. Using the mask pattern as a mask, the first trenches 105t may be formed. The first trenches 105t may be formed by a dry-etching process. The mask pattern may be a photosensitive film pattern or a hard mask pattern. In the current embodiment, after the first trenches 105t are formed, the mask pattern is removed.

The substrate 100 may be, for example, a stacked structure of a base substrate and an epitaxial layer. The substrate 100 may be a silicon substrate, a gallium arsenide substrate, a silicon germanium substrate, a ceramic substrate, a quartz substrate or a glass substrate for displays or may be a semiconductor on insulator (SOI) substrate. In the following description, a silicon substrate will be used as an example. In addition, the substrate 100 may have, for example, a first conductivity type (e.g., a P type).

Figure 3A:
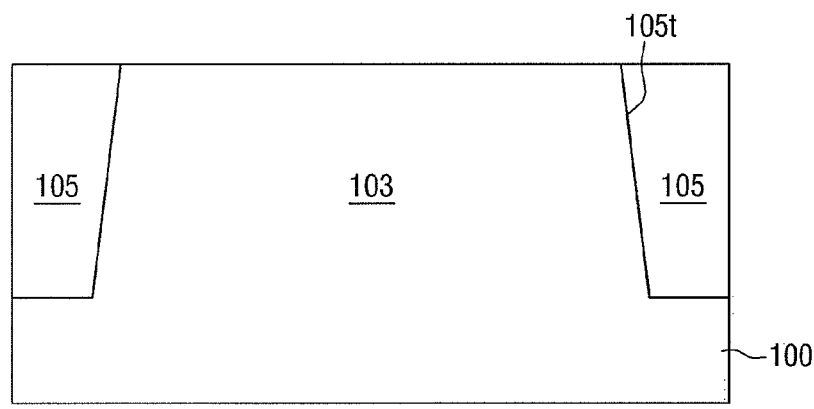
Figure 3B:
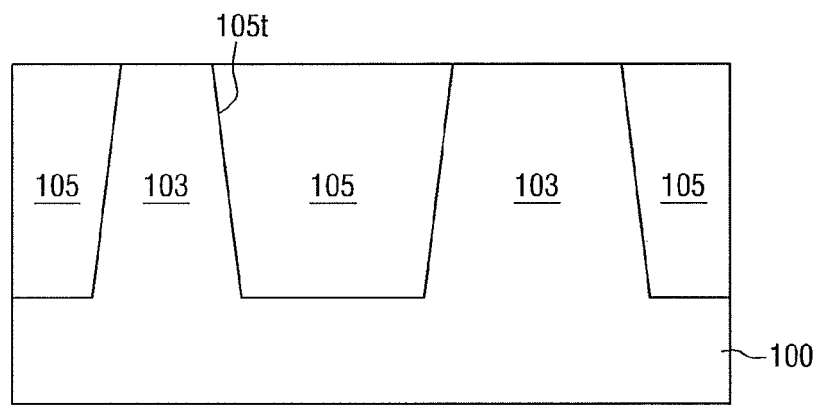

Referring to FIGS. 1, 3A, and 3B, the device isolation region 105 may be formed in each of the first trenches 105t formed to define the unit active region 103. The device isolation region 105 may be formed by filling each of the first trenches 105t with an insulating material. As an example, in the method of fabricating a semiconductor device according to the current embodiment, a top surface of the device isolation region 105 may lie in the same plane with a top surface of the unit active region 103.

The device isolation region 105 may include at least one of an oxide, a nitride, and a oxynitride. To better insulate devices from each other, the device isolation region 105 may include a trench insulating film (not shown) and a trench liner (not shown). The trench insulating film and the trench liner may be conformally formed along inner walls of each of the first trenches 105t. The trench insulating film may help the insulating material, which fills each of the first trenches 105t, to more easily adhere to the inner walls of each of the first trenches 105t. In addition, the trench insulating film may serve to repair a damaged silicon lattice that may exist on the inner walls of the first trenches 105t as a result of an etching process. Accordingly, the trench insulating film may suppress an increase in leakage current of the device isolation region 105 that fills each of the first trenches 105t.

Figure 4A:
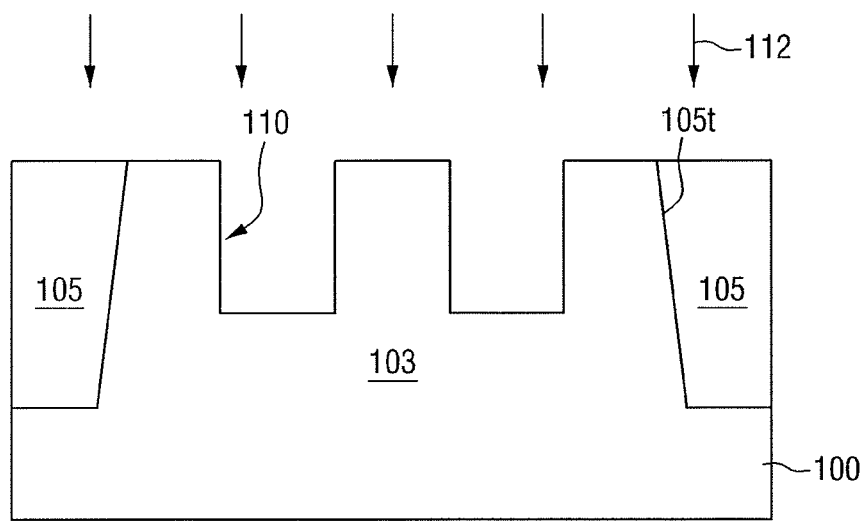
Figure 4B:
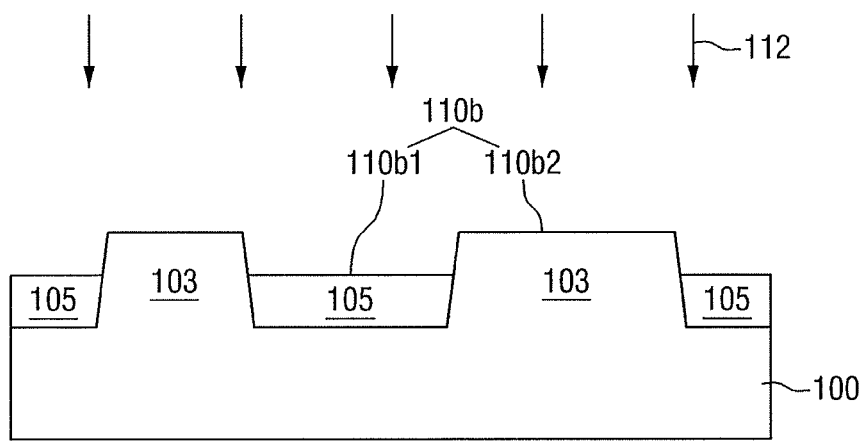

Referring to FIGS. 1, 4A, and 4B, second trenches 110 may be formed in the substrate 100. The second trenches 110 may be formed to cross the unit active region 103 and the device isolation region 105. A gate electrode 130 may be formed in each of the second trenches 110 in a subsequent process. Accordingly, the second trenches 110 may be shaped like lines extending in the second direction DR2.

The second trenches 110 may be formed by forming a mask pattern (not shown) on the substrate 100 and etching the substrate 100 using the mask pattern as an etch mask. The etching process to form the second trenches 110 may be, e.g., a dry-etching process.

The second trenches 110 formed in the unit active region 103 may be shallower than the first trenches 105t formed to define the unit active region 103. The second trenches 110 are formed to cross the device isolation region 105 and the unit active region 103. Accordingly, a bottom surface 110b of each of the second trenches 110 may be uneven. For example, the etching process to form the second trenches 110 may have different etch selectivities with respect to the unit active region 103 and the device isolation region 105.

For example, in the method of fabricating a semiconductor device according to the current embodiment, a bottom surface 110b2 of each of the second trenches 110 in the unit active region 103 may protrude further than the bottom surface 110b1 of each of the second trenches 110 in the device isolation region 105. The unit active region 103 partially covered by the device isolation region 105 may be fin-shaped.

After the second trenches 110 are formed in the substrate 100, the substrate 100 and the second trenches 110 formed in the substrate 100 may be cleaned through a cleaning process 112. The cleaning process 112 may be performed to improve an interface between a gate insulating film to be formed and the second trenches 110. In the cleaning process 112, side surfaces and the bottom surface of each of the second trenches 110 may be oxidized, or an oxide film formed by oxidation of the side surfaces and bottom surface of each of the second trenches 110 may be removed by a wet-etching process.

Referring to FIGS. 5A, 5B, and 7, a pre-gate insulating film 120p may be formed along the side surfaces and bottom surface of the second trenches 110. The pre-gate insulating film 120p may be formed to a uniform thickness along a top surface of the substrate 100 and the second trenches 110. The pre-gate insulating film 120p may include silicon oxide and may be formed by, e.g., atomic layer deposition (ALD).

For example, referring to FIG. 7, the formation of the pre-gate insulating film 120p by ALD may be performed in a temperature range of 200 to 800° C. First, a silicon precursor may be provided. The provided silicon precursor may form a silicon atomic monolayer on the substrate 100 and the side surfaces and bottom surface of each of the second trenches 110. The silicon precursor may include at least one of $SiH_4$, $SiH_2Cl_2$, $SiHCl_3$, $SiCl_4$, $Si(OC_4H_9)_4$, $Si(OCH_3)_4$, and $Si(OC_2H_5)_4$. In other implementations, the silicon precursor may include an alkyl-amino ligand. To remove a portion of the silicon precursor that may fail to bond to the substrate 100 and the second trenches 110, a purge process may be performed. After the purge process, the silicon atomic monolayer may be oxidized. To form a silicon oxide film by oxidizing the silicon atomic monolayer, an oxygen precursor may be provided. The oxygen precursor may include at least one of $H_2O$, $O_2$, $O_3$, O radicals, alcohol, and $H_2O_2$. In other implementations, oxygen plasma may be provided as the oxygen precursor. After the silicon atomic monolayer is oxidized into a silicon oxide film, a purge process may be performed to remove the oxygen precursor. Through the above four processes, one cycle of forming a silicon oxide film using ALD is completed. This cycle may be repeated to form a silicon oxide film, that is, the pre-gate insulating film 120p of a desired thickness.

Using ALD, the pre-gate insulating film 120p may be conformally formed on the unit active region 103 and the device isolation region 105. By providing a silicon source, the pre-gate insulating film 120p may be formed to a uniform thickness without regard to a crystal face of the substrate 100. In addition, by providing the silicon source using ALD, a reduction of a contact area between a contact to be formed and the unit active region 103 may be avoided.

Referring to FIGS. 6A, 6B, and 7, the pre-gate insulating film 120p may be oxidized by a densification process 122. The densification process 122 may oxidize the pre-gate insulating film 120p formed on the side surfaces and bottom surface of the second trenches 110. If the pre-gate insulating film 120p includes silicon oxide, the silicon oxide may be oxidized further by the densification process 122. The oxidation of the pre-gate insulating film 120p results in the formation of a first gate insulating film 120 on the bottom surface and side surfaces of the second trenches 110.

Referring to FIG. 7, the densification process 122 may be performed after the pre-gate insulating film 120p is formed to a desired thickness by ALD.

The pre-gate insulating film 120p formed by ALD may not be dense and may include many defects. In addition, poor interface characteristics of the pre-gate insulating film 120p formed on the side surfaces and bottom surface of the second trenches 110 may cause a leakage current. Therefore, the pre-gate insulating film 120p formed using ALD may be oxidized by the densification process 122. As a result, the first gate insulating film 120 having improved interface characteristics may be formed. The densification process 122 may be performed on the substrate 100 having the pre-gate insulating film 120p. Accordingly, even if the densification process 122 is performed for a long time, the first gate insulating film 120 having a dense structure can be formed with minimum consumption of silicon atoms included in the substrate 100.

The densification process 122 may include at least one of a thermal oxidation process, a plasma oxidation process, an ultraviolet oxidation process, and an ozone oxidation process. The densification process 122 may vary according to how an oxygen source used to oxidize the pre-gate insulating film 120p is provided.

Conditions for some densification processes used in the method of fabricating a semiconductor device according to the embodiments will now be described, as examples.

For example, a thermal oxidation process can be performed as a densification process. The thermal oxidation process uses thermal radical oxygen atoms. In the thermal oxidation process, the rate of oxidation does not vary according to a crystal face, although it typically does in radical oxidation. A silicon oxide film, which is an amorphous film, has the same diffusion characteristics with respect to different crystal faces. Therefore, the degree of diffusion is determined only by a thickness of the silicon oxide film. In addition, the thermal oxidation process uses a monoatomic oxidant. Accordingly, the thermal oxidation process may improve the quality of the pre-gate insulating film 120p. In the thermal oxidation process, a single type using lamps or a batch type using heating resistors may be used. To form radical oxygen atoms, the pressure may be maintained at 50 Torr or below, for example, in a range of 5 to 10 Torr. Oxygen ($O_2$) and hydrogen ($H_2$) may be introduced at 500 to 30,000 sccm and 100 to 3,000 sccm, respectively. The temperature may be in a range of 800 to 1200° C. As a reaction gas for forming the radical oxygen atoms, $O_2+H_2$ or $N_2O+H_2$ may be used.

A plasma oxidation process may also be performed as a densification process. A plasma source used in the plasma oxidation process may be a radio frequency (RF) or a microwave (2.45 GHz). In addition, a reaction gas used in the plasma oxidation process may be one of $O_2$, $H_2+O_2$, $Ar+O_2$, and $Ar+O_2+H_2$. The plasma oxidation process may be performed at a temperature of 200 to 800° C.

An ultraviolet oxidation process and an ozone oxidation process, which are also densification processes, may be performed at a temperature of 600° C. or below.

Referring to FIGS. 6A and 6B, after the first gate insulating film 120 is formed by oxidizing the pre-gate insulating film 120p using the densification process 122, a high-temperature annealing process may further be performed. The high-temperature annealing process can further improve the quality of the first gate insulating film 120.

Examples of the high-temperature annealing process include $N_2$ atmosphere annealing, vacuum annealing, and rapid thermal annealing.

After the first gate insulating film 120 is formed by the densification process 122, a high-k gate insulating film (not shown) may further be formed on the first gate insulating film 120. The high-k gate insulating film may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

As an example, in the method of fabricating a semiconductor device according to the current embodiment, after the pre-gate insulating film 120p is formed, the gate insulating film 120 may not be additionally deposited before or after the densification process 122. In other implementations, an additional gate insulating film may be deposited after or before the densification process 122 using a biased plasma oxidation process. As a result, the gate insulating film formed on the bottom surface of the second trenches 110 may become thicker. This will be described in more detail below with reference to FIG. 18.

Figure 8:
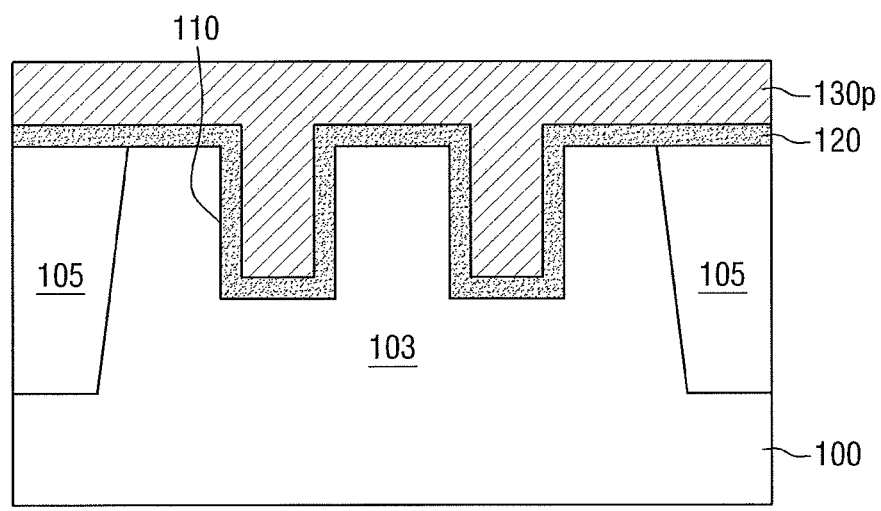

Referring to FIG. 8, a gate electrode film 130p may be formed on the whole surface of the substrate 100. The gate electrode film 130p may fill the second trenches 110 having the first gate insulating film 120.

The gate electrode film 130p may be formed by physical vapor deposition (PVD), chemical vapor deposition (CVD), or ALD. The gate electrode film 130p may be made of a conductive material such as, for example, doped polysilicon, titanium nitride (TiN), tantalum nitride (TaN), tungsten nitride (WN), titanium (Ti), tantalum (Ta), or tungsten (W).

Figure 9:
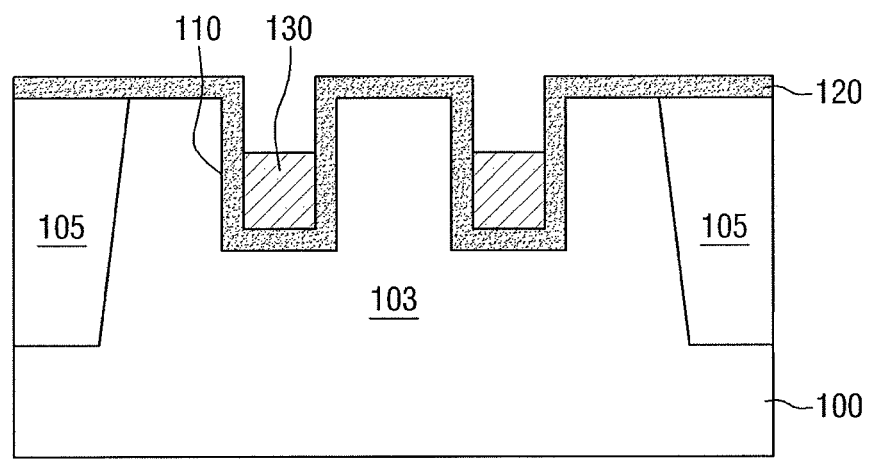

Referring to FIG. 9, a gate electrode 130 may be formed in each of the second trenches 110 by etching the gate electrode film 130p. The gate electrode 130 may partially fill each of the second trenches 110 having the first gate electrode film 120.

As a result of etching the gate electrode film 130p, a top surface of the gate electrode 130 may be formed to be lower than the top surface of the substrate 100. In the etching of the gate electrode film 130p, the gate electrode film 130p may be etched-back.

Figure 10:
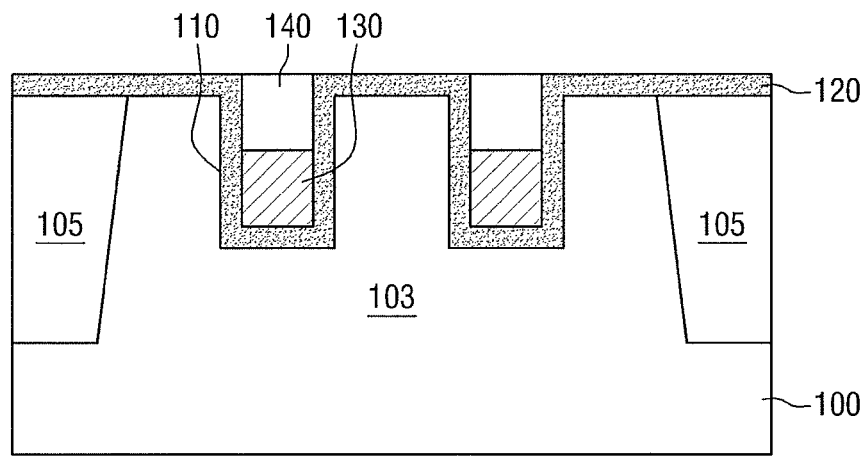

Referring to FIG. 10, a capping pattern 140 may be formed in each of the second trenches 110.

The capping pattern 140 may be formed by forming a capping film (not shown) on the whole surface of the substrate 100 and etching the capping film until the first gate insulating film 120 formed on the top surface of the substrate 100 is exposed. The capping film may be formed by, e.g., CVD. The etching process for forming the capping pattern 140 may be at least one of a chemical mechanical polishing (CMP) process, a dry-etching process, and a wet-etching process. The capping pattern 140 may include an insulating material. For example, the capping pattern 140 may include at least one of silicon oxide, silicon nitride, and silicon oxynitride.

In the current embodiment, a top surface of the capping pattern 140 may lie in the same plane with a top surface of the first gate insulating film 120 formed on the top surface of the substrate 100. In other implementations, when the capping film is etched to form the capping pattern 140, it may be etched until the top surface of the substrate 100 is exposed.

In the current embodiment, the first gate insulating film 120 is formed on side surfaces of the capping pattern 140. In other implementations, before the capping film is formed, the first gate insulating film 120 that is formed on the top surface of the substrate 100 and the first gate insulating film 120 that is formed in each of the second trenches 110 and does not contact the gate electrode 130 may be removed. In this case, the first gate insulating film 120 may not be located between the capping pattern 140 and the unit active region 103.

Figure 11:
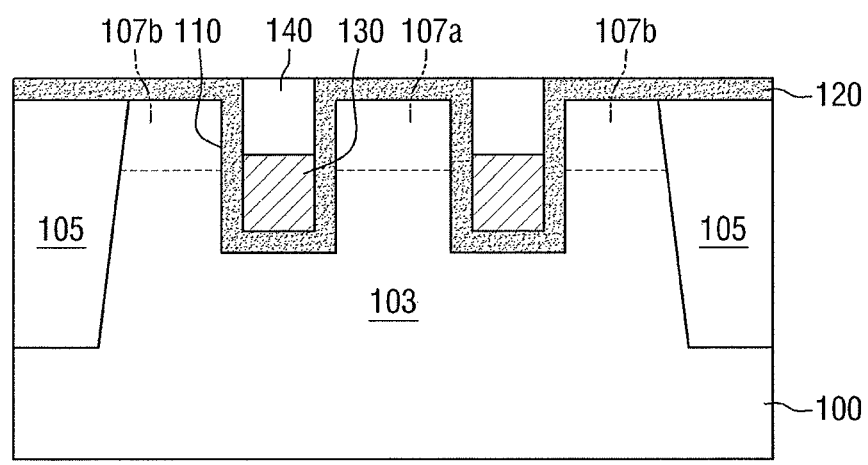

Referring to FIG. 11, source/drain regions 107a and 107b may be formed in the unit active region 103 on both sides of the second trenches 110 to be adjacent to the second trenches 110. In the method of fabricating a semiconductor device according to the current embodiment, a first source/drain region 107a and a pair of second source/drain regions 107b may be formed in the unit active region 103. A pair of the gate electrodes 130 and the first source/drain region 107a may be formed between the pair of the second source/drain regions 107b.

Bottom surfaces of the first and second source/drain regions 107a and 107b may be formed in a depth direction from the top surface of the unit active region 103. The first and second source/drain regions 107a and 107b may contact sidewalls of the second trenches 110. The first and second source/drain regions 107a and 107b may be formed by injecting impurities into the unit active region 103. The impurities may include phosphorous (P) or boron (B). In the method of fabricating a semiconductor device according to the embodiments, the bottom surfaces of the first and second source/drain regions 107a and 107b may be closer to the top surface of the substrate 100 than the bottom surface of the second trenches 110.

Figure 12:
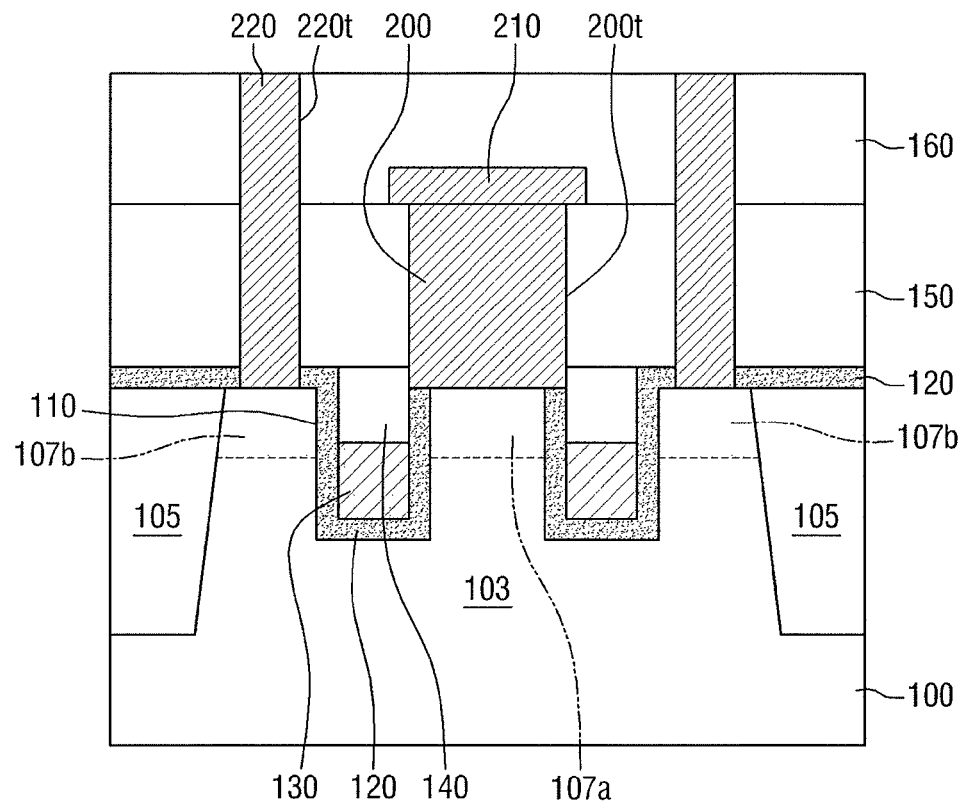

Referring to FIG. 12, a first interlayer insulating film 150 may be formed on the substrate 100. The first interlayer insulating film 150 may include at least one of silicon oxide, silicon nitride, and silicon oxynitride. The first interlayer insulating film 150 may be a single layer or a multilayer.

A first through-hole 200t may be formed in the first interlayer insulating film 150. The first through-hole 200t may pass through the first interlayer insulating film 150 to expose the first source/drain region 107a. The first through-hole 200t may be formed by, e.g., a dry-etching process.

A first contact plug 200 may be formed in the first through-hole 200t. The first contact plug 200 may include a conductive material. For example, the first contact plug 200 may include at least one of polycrystalline silicon, a metal silicon compound, conductive metal nitride, and metal.

A bit line 210 may be formed on the first interlayer insulating film 150 to be electrically connected to the first contact plug 200. Referring to FIG. 1, the bit line 210 may be shaped like a line extending in the third direction DR3. The bit line 210 may extend in a direction orthogonal to the gate electrode 130, as an example. The bit line 210 may include a conductive material. For example, the bit line 210 may include at least one of polycrystalline silicon, a metal silicon compound, conductive metal nitride, and metal.

A second interlayer insulating film 160 may be formed on the first interlayer insulating film 150 to cover the bit line 210. The second interlayer insulating film 160 may be formed by, e.g., CVD. The second interlayer insulating film 160 may include at least one of silicon oxide, silicon nitride, and silicon oxynitride. The second interlayer insulating film 160 may be a single layer or a multilayer.

Second through-holes 220t may be formed in the first interlayer insulating film 150 and the second interlayer insulating film 160. The second through-holes 220t may pass through the first interlayer insulating film 150 and the second interlayer insulating film 160 to expose the second source/drain regions 107b. The second through-holes 220t may be formed by, e.g., a dry-etching process.

A second contact plug 220 may be formed in each of the second through-holes 220t. The second contact plug 220 may include a storage node contact. The second contact plug 220 may include a conductive material. For example, the second contact plug 220 may include at least one of polycrystalline silicon, a metal silicon compound, conductive metal nitride, and metal.

An information storage element may be formed on the second interlayer insulating film 160 to be electrically connected to the second contact plug 220. The information storage element may be, for example, a capacitor and may include a storage node that contacts the second contact plug 220. In other implementations, the information storage element may be a variable resistor, for example, a phase-change material or a magnetic tunnel junction pattern.

A method of fabricating a semiconductor device according to another embodiment will now be described with reference to FIGS. 2A through 4B and 8 through 17. The current embodiment is substantially identical to the previous embodiment, except for a method of forming a first gate insulating film. Therefore, elements substantially identical to those of the previous embodiment are indicated by like reference numerals, and their description will be given briefly to avoid repetition.

Figure 15:
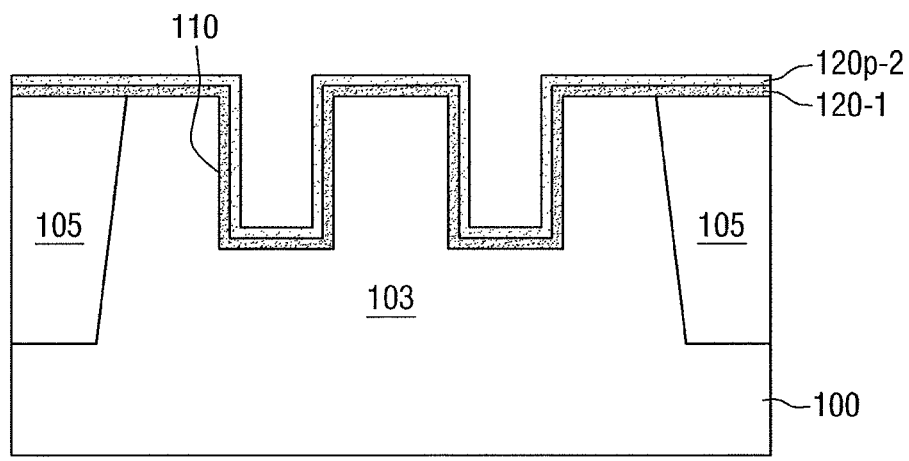
Figure 16:
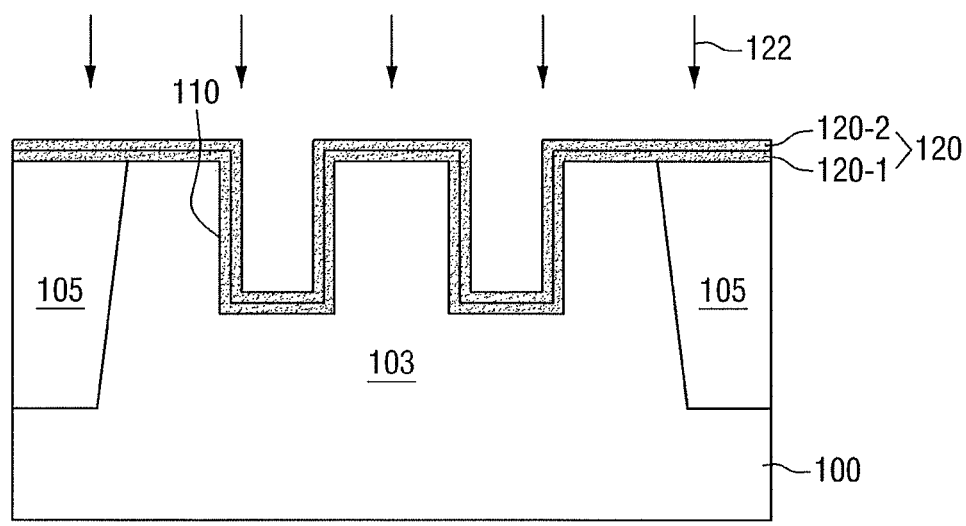
Figure 17:
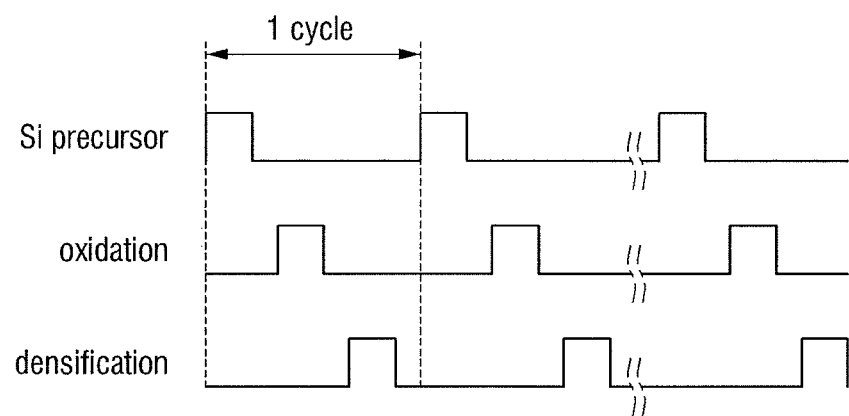
FIG. 17 illustrates a timing diagram with respect to the process stages illustrated in FIGS. 13 through 16

FIGS. 13 through 17 are views illustrating a method of fabricating a semiconductor device according to another embodiment. FIGS. 13 through 16 are cross-sectional views taken along the line A-A of FIG. 1 and illustrating intermediate processes included in the fabrication method according to the current embodiment. FIG. 17 is a timing diagram illustrating the processes of FIGS. 13 through 16.

Referring to FIGS. 13 through 16, forming a pre-gate insulating film 120p and oxidizing the pre-gate insulating film 120p may be repeated to form a first gate insulating film 120 on side surfaces and a bottom surface of each second trench 110.

Figure 13:
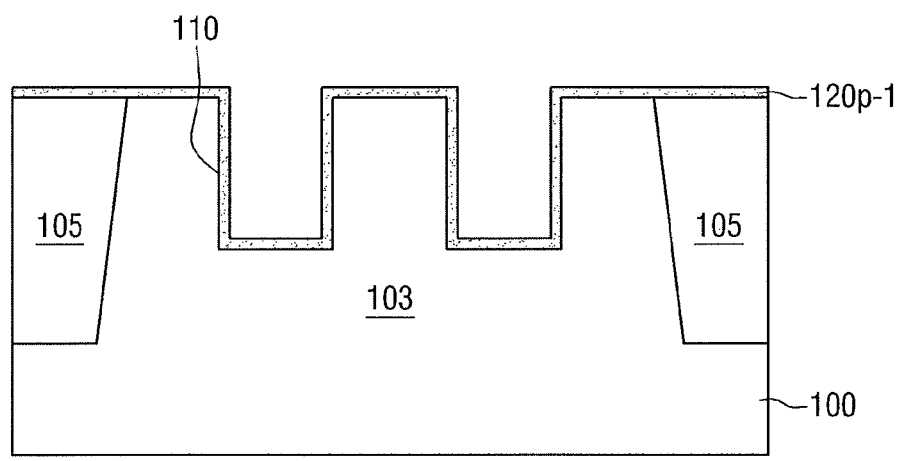
FIGS. 13 through 16 illustrate cross-sectional views taken along the line A-A of FIG. 1 depicting stages of a method of fabricating a semiconductor device according to another embodiment.

Specifically, referring to FIG. 13, a first portion 120p-1 of the pre-gate insulating film 120p may be formed along the side surfaces and bottom surface of the second trenches 110. The first portion 120p-1 of the pre-gate insulating film 120p may be formed to a uniform thickness along a top surface of a substrate 100 and the second trenches 110. The first portion 120p-1 of the pre-gate insulating film 120p may include silicon oxide and may be formed by ALD.

The first portion 120p-1 of the pre-gate insulating film 120p may be silicon oxide formed by oxidizing a silicon atomic monolayer.

Figure 14:
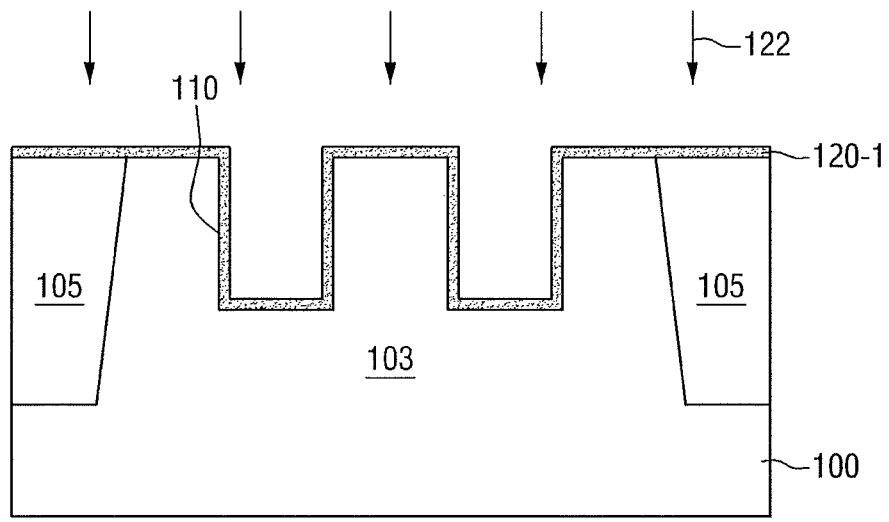

Referring to FIG. 14, the first portion 120p-1 of the pre-gate insulating film 120p may be oxidized by a densification process 122. The densification process 122 may further oxidize the silicon oxide that is the first portion 120p-1 of the pre-gate insulating film 120p. As a result of the oxidation of the first portion 120p-1 of the pre-gate insulating film 120p, a first portion 120-1 of the first gate insulating film 120 is formed on the bottom surface and side surfaces of the second trenches 110.

Referring to FIG. 15, a second portion 120p-2 of the pre-gate insulating film 120p may be formed on the first portion 120-1 of the first gate insulating film 120. Like the first portion 120p-1 of the pre-gate insulating film 120p, the second portion 120p-2 of the pre-gate insulating film 120p may be silicon oxide formed by oxidizing a silicon atomic monolayer.

Referring to FIG. 16, the second portion 120p-2 of the pre-gate insulating film 120p may be oxidized by a densification process 122. Here, the first portion 120-1 of the first gate insulating film 120 may also be densified. As a result of the oxidation of the second portion 120p-2 of the pre-gate insulating film 120p, a second portion 120-2 of the first gate insulating film 120 is formed on the first portion 120-1 of the first gate insulating film 120.

The processes of FIGS. 15 and 16 may be repeated n times (where n is a natural number). A process of forming a portion of the first gate insulating film 120 by forming a portion of a pre-gate electrode and oxidizing the portion of the pre-gate electrode through a densification process may be repeated. As a result, the first gate insulating film 120 may be formed on the top surface of the substrate 100 and the bottom surface and side surfaces of the second trenches 110.

Referring to FIGS. 13 through 17, a silicon atomic monolayer may be formed by providing a silicon precursor. Then, the silicon atomic monolayer is oxidized to form a portion of the pre-gate insulating film 120p. Finally, a densification process 122 is performed on the portion of the pre-gate insulating film 120p, thereby forming a portion of the first gate insulating film 120. These processes form one ALD cycle. The densification process 122 included in one ALD cycle may be shorter than the densification process 122 described above with reference to FIG. 7. This is because the pre-gate insulating film 120p to be oxidized by the densification process 122 here is thin.

In the method of fabricating a semiconductor device according to the embodiments, one ALD cycle includes one round of providing a silicon precursor, one round of oxidizing a silicon atomic monolayer, and one round of a densification process 122. In other implementations, one ALD cycle may include multiple rounds of providing a silicon precursor, multiple rounds of oxidizing a silicon atomic monolayer, and then one round of the densification process 122.

After the first gate insulating film 120 is formed in the second trenches 110, a gate electrode 130 may be formed to partially fill each of the second trenches 110.

A method of fabricating a semiconductor device according to another embodiment will now be described with reference to FIGS. 2A through 12 and 18.

Figure 18:
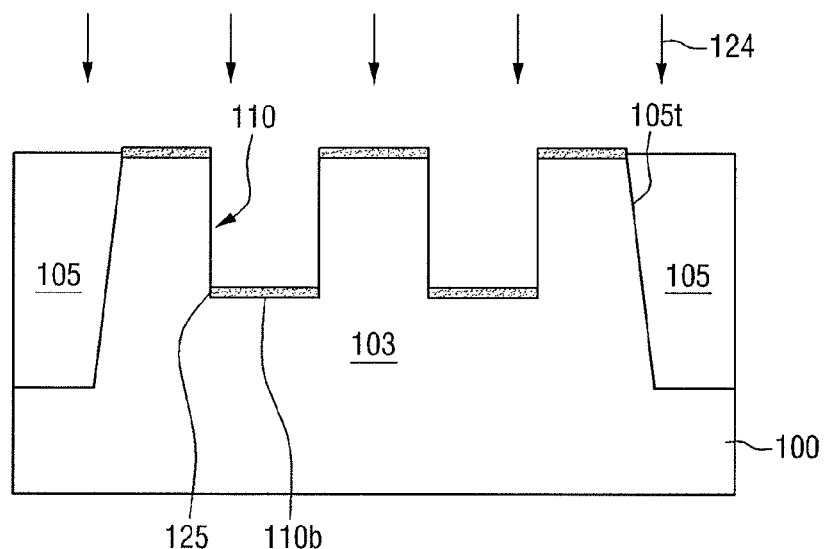
FIG. 18 illustrates a view depicting a method of fabricating a semiconductor device according to another embodiment.

FIG. 18 is a view illustrating a method of fabricating a semiconductor device according to another embodiment.

Referring to FIG. 18, a second gate insulating film 125 may be formed in each second trench 110 using a biased plasma oxidation process 124. For example, the second gate insulating film 125 may be formed on a bottom surface 110b of each second trench 110 using the biased plasma oxidation process 124. The second gate insulating film 125 may also be formed in a portion of a unit active region 103 that lies at the same level as a top surface of a substrate 100.

For example, to increase the oxidizing power of the bottom surface 110b of each of the second trenches 110, bias power may be applied to the substrate 100 using an RF. The bias power may be applied as a continuous wave or a pulsed wave. The bias power increases the linearity of oxygen in a direction normal to the top surface of the substrate 100. The concentration of oxygen reaching the bottom surface 110b of each of the second trenches 110 may be greater than that of oxygen reaching side surfaces of each of the second trenches 110. The greater concentration of oxygen oxidizes the bottom surface 110b of each of the second trenches 110 more easily. Therefore, the second gate insulating film 125 is not formed on the side surfaces of each of the second trenches 110, but is formed on the bottom surface 110b of each of the second trenches 110.

As the second trenches 110 in which a gate electrode 130 is formed become narrower, an oxidant (e.g., oxygen) reaching the bottom surface 110b of each of the second trenches 110 may be reduced. The reduced oxygen reaching the bottom surface 110b of each of the second trenches 110 may lead to a reduced thickness of a gate insulating film formed on the bottom surface 110b of each of the second trenches 110. If the thickness of the gate insulating film is not uniform, electrical stress may be concentrated in a thin portion of the gate insulating film, thereby undermining the reliability of a semiconductor device. In contrast, according to the present embodiment, the greater concentration of oxygen provided by the biased plasma oxidation process 124 oxidizes the bottom surface 110b of each of the second trenches 110 more easily.

Next, a pre-gate insulating film 120p may be formed along the side surfaces of each of the second trenches 110 and the second gate insulating film 125 formed on the bottom surface 110b of each of the second trenches 110.

A method of fabricating a semiconductor device according to another embodiment will now be described with reference to FIGS. 2A through 12 and 19.

Figure 19:
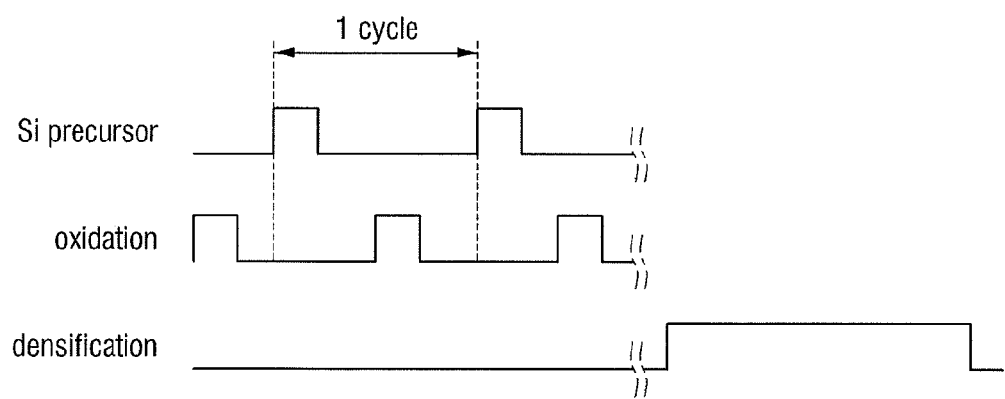
FIG. 19 illustrates a timing diagram regarding a method of fabricating a semiconductor device according to another embodiment.

FIG. 19 is a timing diagram illustrating a method of fabricating a semiconductor device according to another embodiment.

Referring to FIG. 19, side surfaces and a bottom surface of each second trench 110 may be oxidized before a pre-gate insulating film is formed on the side surfaces and bottom surface of each second trench 110 using ALD.

For example, before a silicon precursor is provided, the side surfaces and bottom surface of each of the second trenches 110 may be oxidized. The side surfaces and bottom surface of each of the second trenches 110 may be oxidized by providing, e.g., an oxygen precursor. The oxygen precursor may include at least one of $H_2O$, $O_2$, $O_3$, O radicals, alcohol, and $H_2O_2$. In other implementations, oxygen plasma may be provided as the oxygen precursor. As a result of the oxidation process, an oxide film may be formed on the side surfaces and bottom surface of each of the second trenches 110.

The oxidation process performed before an initial silicon precursor is provided may be continued until a single layer of silicon oxide is formed on surfaces of each of the second trenches 110. If the time taken for the oxidation process performed before the initial silicon precursor is provided is increased, a gate insulating film may not be formed to a uniform thickness within each of the second trenches 110. The oxidation process consumes silicon included in a substrate 100 without the supply of silicon atoms and thus the thickness of the gate insulating film varies according to the crystal face of the silicon.

In the methods of fabricating a semiconductor device according to the embodiments of FIGS. 1 through 19, a gate insulating film is formed within a trench. In other implementations, when a gate insulating film of a planar transistor is formed, a pre-gate insulating film may also be formed by ALD, and a gate insulating film may also be formed by oxidizing the pre-gate insulating film through a densification process.

Figure 20:
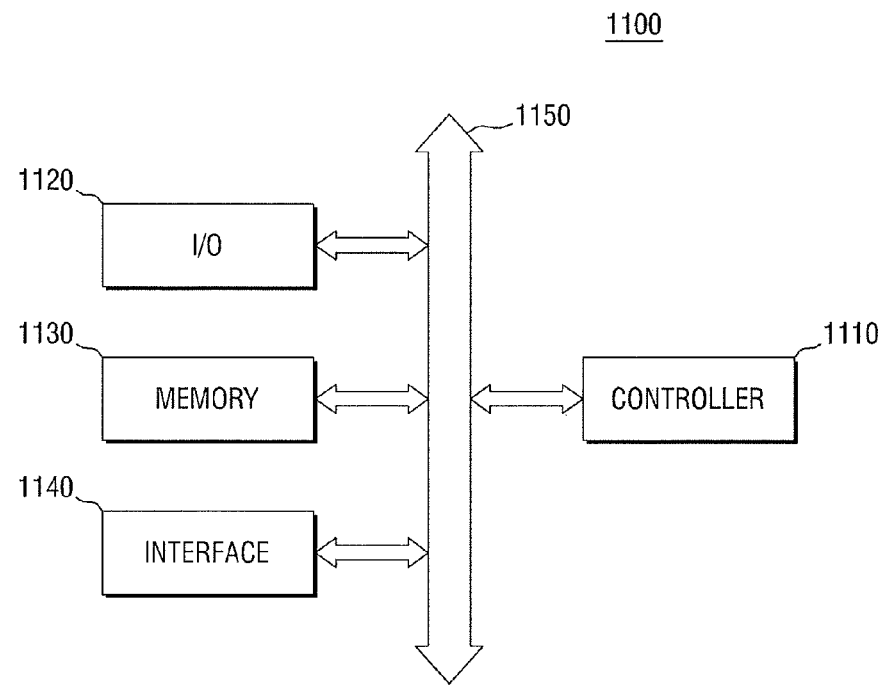
FIG. 20 illustrates a block diagram of an example electronic system including a semiconductor device fabricated using a method of fabricating a semiconductor device according to embodiments.

FIG. 20 is a block diagram of an example electronic system 1100 including a semiconductor device fabricated using a method of fabricating a semiconductor device according to embodiments.

Referring to FIG. 20, the electronic system 1100 according to embodiments may include a controller 1110, an input/output (I/O) device 1120, a memory device 1130, an interface 1140, and a bus 1150. The controller 1110, the I/O device 1120, the memory device 1130, and/or the interface 1140 may be coupled to each other through the bus 1150. The bus 1150 corresponds to a path through which data is transferred.

The controller 1110 may include at least one of a microprocessor, a digital signal processor, a microcontroller, and at least one of logic devices capable of performing similar functions to the above elements. The I/O device 1120 may include at least one of a keypad, a keyboard, and a display device. The memory device 1130 may store data and/or commands. The memory device 1130 may include any one of the semiconductor devices disclosed in the above embodiments. The memory device 1130 may include a DRAM. The interface 1140 may transmit data to a communication network or receive data from the communication network. The interface 1140 can be in a wired or wireless form. For example, the interface 1140 may be an antenna or a wired/wireless transceiver.

The electronic system 1100 can be applied to a personal digital assistant (PDA), a portable computer, a web tablet, a wireless phone, a mobile phone, a digital music player, a memory card, and all electronic products that can transmit and/or receive information in a wireless environment.

Figure 21:
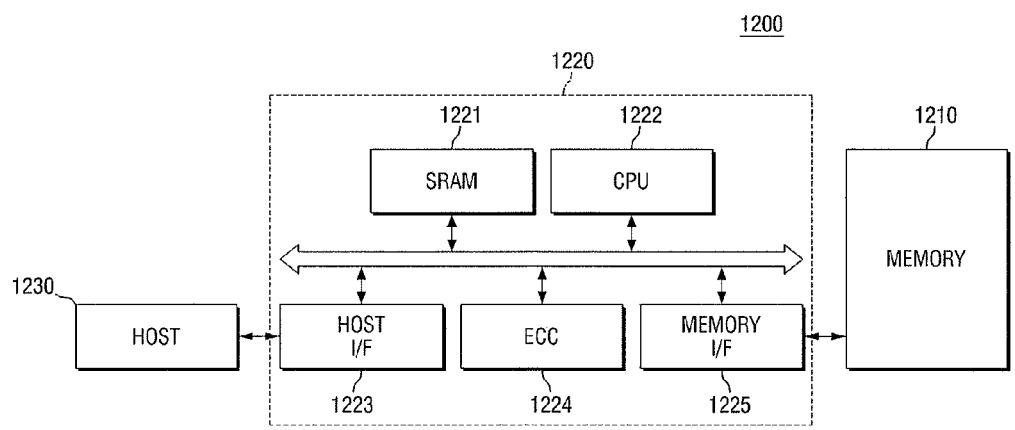
FIG. 21 illustrates a block diagram of an example memory card including a semiconductor device fabricated using a method of fabricating a semiconductor device according to embodiments.

FIG. 21 is a block diagram of an example memory card 1200 including a semiconductor device fabricated using a method of fabricating a semiconductor device according to embodiments.

Referring to FIG. 21, a memory 1210 including a semiconductor device fabricated according to various embodiments may be employed in the memory card 1200. The memory card 1200 may include a memory controller 1220 that controls data exchange between a host 1230 and the memory 1210. A static random access memory (SRAM) 1221 may be used as an operation memory of a central processing unit (CPU) 1222. A host interface 1223 may include protocols used by the host 1230 to access the memory card 1200 and exchange data with the memory card 1200. An error correction code (ECC) 1224 may detect and correct errors of data read from the memory 1210. A memory interface 1225 may interface with the memory 1210. The CPU 1222 may control the overall data exchange-related operation of the memory controller 1220.

By way of summation and review, in a semiconductor device such as, for example, a buried channel array transistor (BCAT), if a cell gate oxide is formed only by thermal oxidation of an exposed surface of the active region, the thickness of the gate oxide at corner regions may be thinner than at other regions, so that an electrical field may be concentrated on the gate oxide at the corner. In addition, the area of the active region may be decreased.

In contrast, embodiment provide a method of fabricating a semiconductor device with improved gate-induced drain leakage (GIDL) characteristics and reliability by forming a gate insulating film using atomic layer deposition (ALD) and a densification process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of fabricating a semiconductor device, the method comprising:
   forming a trench in a substrate;
   forming a pre-gate insulating film along side surfaces and a bottom surface of the trench;
   oxidizing the pre-gate insulating film through a densification process;
   forming a first gate insulating film by oxidizing the pre-gate insulating film, and
   forming a gate electrode in the trench having the first gate insulating film to partially fill the trench.

2. The method as claimed in claim 1, wherein the densification process includes at least one of a thermal oxidation process, a plasma oxidation process, an ultraviolet oxidation process, and an ozone oxidation process.

3. The method as claimed in claim 2, further comprising performing a high-temperature annealing process after the densification process.

4. The method as claimed in claim 1, further comprising:
   repeating the forming of the pre-gate insulating film and the oxidizing of the pre-gate insulating film through the densification process to form the first gate insulating film on the side surfaces and bottom surface of the trench.

5. The method as claimed in claim 1, further comprising forming a second gate insulating film on the bottom surface of the trench using a biased plasma oxidation process before the forming of the pre-gate insulating film.

6. The method as claimed in claim 1, further comprising oxidizing the bottom surface and side surfaces of the trench before the forming of the pre-gate insulating film.

7. The method as claimed in claim 1, wherein the pre-gate insulating film is formed by atomic layer deposition (ALD).

8. The method as claimed in claim 1, further comprising cleaning the trench before the forming of the pre-gate insulating film.

9. The method as claimed in claim 1, wherein the pre-gate insulating film includes silicon oxide.

10. A method of fabricating a semiconductor device, the method comprising:
    forming a device isolation region in a substrate to define an active region;
    forming a trench that crosses the active region and the device isolation region;
    forming a pre-gate insulating film along side surfaces and a bottom surface of the trench using atomic layer deposition (ALD); and
    oxidizing the pre-gate insulating film through a densification process,
    wherein the bottom surface of the trench defined by the active region and the device isolation region is uneven.

11. The method as claimed in claim 10, wherein the densification process includes at least one of a thermal oxidation process, a plasma oxidation process, an ultraviolet oxidation process, and an ozone oxidation process.

12. The method as claimed in claim 10, further comprising forming a first gate insulating film by oxidizing the pre-gate insulating film and then forming a gate electrode in the trench having the first gate insulating film to partially fill the trench.

13. The method as claimed in claim 10, further comprising forming a second gate insulating film on the bottom surface of the trench using a biased plasma oxidation process before the forming of the pre-gate insulating film.

14. The method as claimed in claim 10, further comprising:
    repeating the forming of the pre-gate insulating film and the oxidizing of the pre-gate insulating film to form a first gate insulating film on the side surfaces and bottom surface of the trench, and then
    forming a gate electrode in the trench having the first gate insulating film to partially fill the trench.

15. A method of fabricating a semiconductor device, the method comprising:
    forming a trench in a substrate;
    forming a silicon monolayer directly on and along side surfaces and on a bottom surface of the trench by atomic layer deposition (ALD);
    oxidizing the silicon monolayer to form a silicon oxide film;
    repeating forming the silicon monolayer and oxidizing the silicon monolayer to form a pre-gate insulating film of silicon oxide on the side surfaces and bottom surfaces of the trench; and
    performing a densification process to further oxidize the pre-gate insulating film to form a gate insulating film.

16. The method as claimed in claim 15, wherein:
    forming the silicon monolayer includes depositing a silicon precursor, and
    oxidizing the silicon monolayer includes supplying an oxygen precursor.

17. The method as claimed in claim 15, wherein the densification process includes at least one of a thermal oxidation process, a plasma oxidation process, an ultraviolet oxidation process, and an ozone oxidation process.

18. The method as claimed in claim 15, further comprising performing a high-temperature annealing process after the densification process.

19. The method as claimed in claim 15, further comprising oxidizing the bottom and side surfaces of the trench before an initial forming of the silicon monolayer.

20. The method as claimed in claim 15, further comprising forming the pre-gate insulating film directly on the bottom surface of the trench.

* * * * *